(12) United States Patent
Loh

(10) Patent No.: US 8,502,261 B2
(45) Date of Patent: Aug. 6, 2013

(54) SIDE MOUNTABLE SEMICONDUCTOR LIGHT EMITTING DEVICE PACKAGES AND PANELS

(75) Inventor: Ban P. Loh, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/038,628

(22) Filed: Mar. 2, 2011

(65) Prior Publication Data

US 2011/0169020 A1 Jul. 14, 2011

Related U.S. Application Data

(63) Continuation of application No. 11/744,286, filed on May 4, 2007, now Pat. No. 7,910,944.

(51) Int. Cl.
*H01L 33/48* (2010.01)
*H01L 33/60* (2010.01)
*H01L 33/10* (2010.01)

(52) U.S. Cl.
USPC ........ 257/99; 257/103; 257/81; 257/E33.056; 257/E33.072; 438/28; 438/27; 438/21; 438/106; 438/113

(58) Field of Classification Search
USPC ....... 257/99, 88, E33.056, E33.072, E33.001, 257/103, 700, 81; 438/28, 27, 21, 106, 113
See application file for complete search history.

(56) References Cited

U.S. PATENT DOCUMENTS

| | | | |
|---|---|---|---|
| 4,918,497 A | 4/1990 | Edmond | 357/17 |
| 4,966,862 A | 10/1990 | Edmond | 437/100 |
| 5,027,168 A | 6/1991 | Edmond | 357/17 |
| 5,210,051 A | 5/1993 | Carter, Jr. | 437/107 |
| 5,277,840 A | 1/1994 | Osaka et al. | 252/301.36 |
| 5,338,944 A | 8/1994 | Edmond et al. | 257/76 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 437/22 |
| 5,631,190 A | 5/1997 | Negley | 438/33 |
| 5,739,554 A | 4/1998 | Edmond et al. | 257/103 |
| 5,806,955 A | 9/1998 | Parkyn, Jr. et al. | 362/31 |
| 5,813,753 A | 9/1998 | Vriens et al. | 362/293 |
| 5,858,278 A | 1/1999 | Itoh et al. | 252/301.4 |
| 5,912,477 A | 6/1999 | Negley | 257/95 |
| 5,959,316 A | 9/1999 | Lowery | 257/98 |
| 6,069,440 A | 5/2000 | Shimizu et al. | 313/486 |
| 6,120,600 A | 9/2000 | Edmond et al. | 117/89 |
| 6,187,606 B1 | 2/2001 | Edmond et al. | 438/46 |
| 6,201,262 B1 | 3/2001 | Edmond et al. | 257/77 |
| 6,252,254 B1 | 6/2001 | Soules et al. | 257/89 |

(Continued)

*Primary Examiner* — Cathy N Lam
(74) *Attorney, Agent, or Firm* — Myers Bigel Sibley & Sajovec, P.A.

(57) ABSTRACT

Side-mountable semiconductor light emitting device packages include an electrically insulating substrate having a front face and a back face and a side face extending therebetween. The side face is configured for mounting on an underlying surface. An electrically conductive contact is provided proximate an edge of the substrate on the back face of the substrate and/or on a recessed region on the side face of the substrate. The contact is positioned to be positioned proximate an electrical connection region of the underlying surface when the semiconductor light emitting device package is side mounted on the underlying surface. A conductive trace extends along the front face of the substrate and is electrically connected to the contact. A semiconductor light emitting device is mounted on the front face of the substrate and electrically connected to the conductive trace.

7 Claims, 6 Drawing Sheets

U.S. PATENT DOCUMENTS

| | | | |
|---|---|---|---|
| 6,598,998 B2 | 7/2003 | West et al. | 362/307 |
| 6,607,287 B1 | 8/2003 | Ayala, Jr. et al. | 362/259 |
| 6,953,952 B2 | 10/2005 | Asakawa | 257/103 |
| 2002/0123164 A1 | 9/2002 | Slater, Jr. et al. | 438/39 |
| 2003/0006418 A1 | 1/2003 | Emerson et al. | 257/79 |
| 2004/0041222 A1 | 3/2004 | Loh | 257/433 |
| 2004/0056260 A1 | 3/2004 | Slater, Jr. et al. | 257/79 |
| 2004/0084738 A1 | 5/2004 | Thomas | 257/414 |
| 2005/0007783 A1 | 1/2005 | Ono | 362/294 |
| 2005/0127816 A1 | 6/2005 | Sumitani | 313/498 |
| 2006/0280221 A1* | 12/2006 | Seitel | 372/100 |
| 2008/0128894 A1* | 6/2008 | Sakano | 257/700 |

* cited by examiner

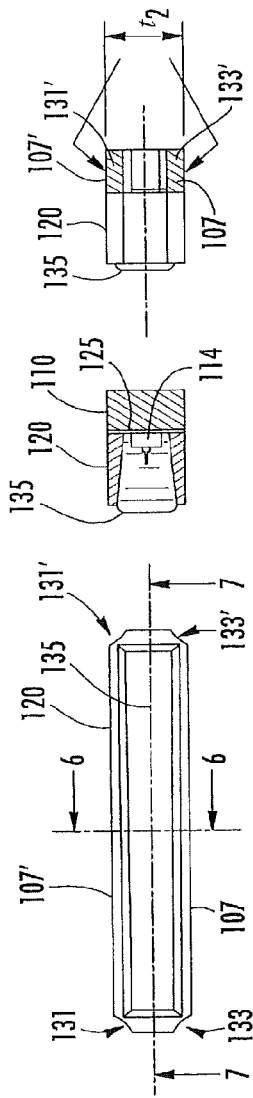
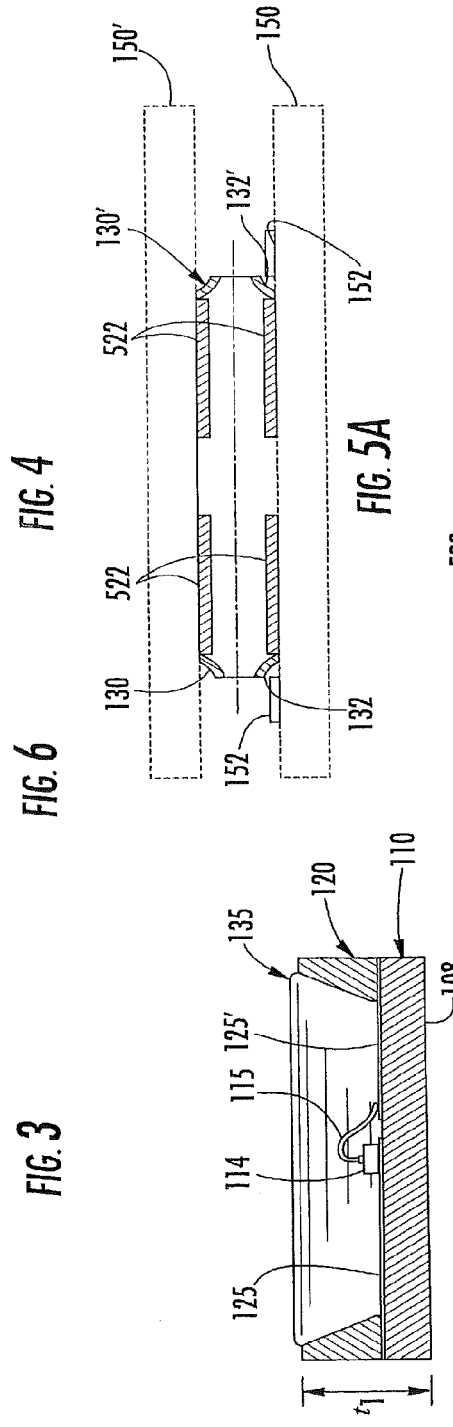

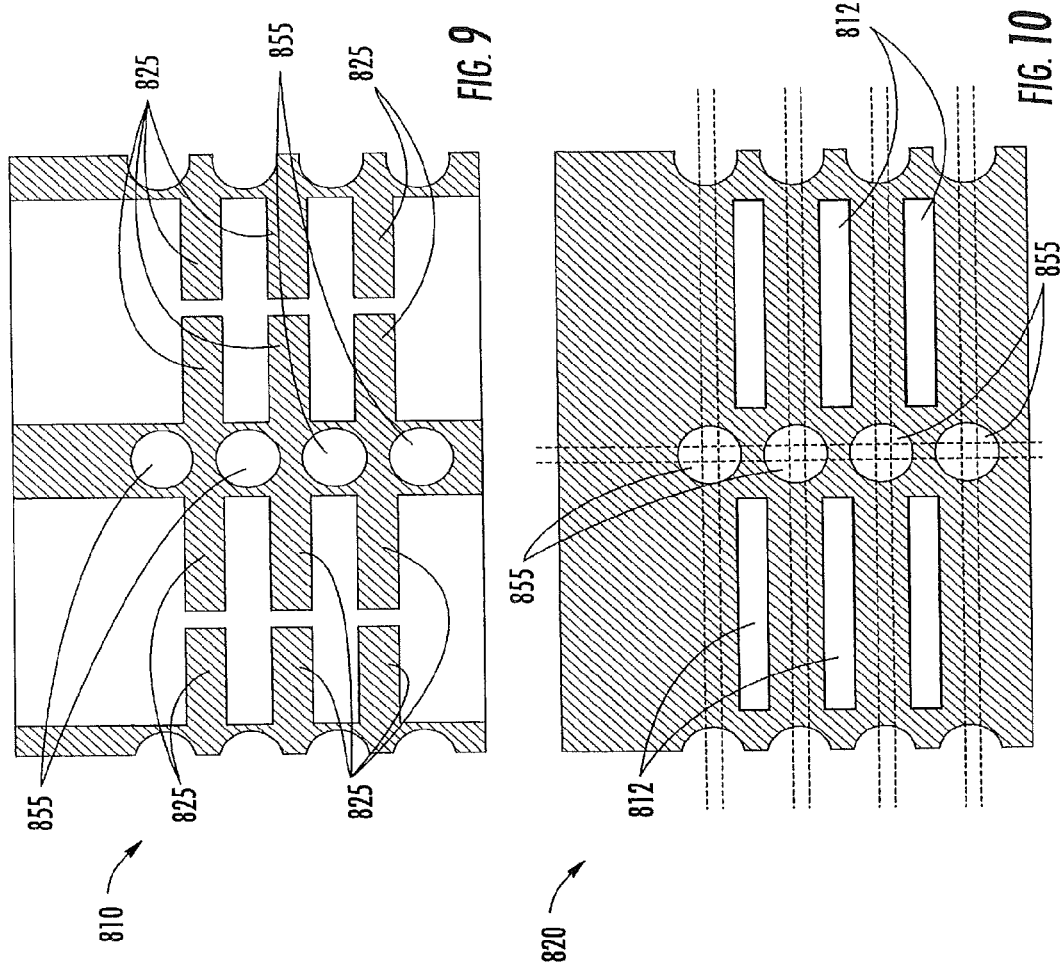

SIDE MOUNTABLE SEMICONDUCTOR LIGHT EMITTING DEVICE PACKAGES AND PANELS

RELATED APPLICATIONS

This application claims priority to and is a continuation of parent application Ser. No. 11/744,286, filed May 4, 2007, now U.S. Pat. No. 7,910,944 the disclosure of which is hereby incorporated herein by reference as if set forth in its entirety.

BACKGROUND OF THE INVENTION

This invention relates to semiconductor light emitting devices and manufacturing methods therefor, and more particularly to packaging and packaging methods for semiconductor light emitting devices.

Semiconductor light emitting devices, such as Light Emitting Diodes (LEDs) or laser diodes, are widely used for many applications. As is well known to those having skill in the art, a semiconductor light emitting device includes one or more semiconductor layers that are configured to emit coherent and/or incoherent light upon energization thereof. It is also known that the semiconductor light emitting device generally is packaged to provide external electrical connections, heat sinking, lenses or waveguides, environmental protection and/or other functions. For example, it is known to provide a two-piece package for a semiconductor light emitting device, wherein the semiconductor light emitting device is mounted on a substrate that comprises alumina, aluminum nitride and/or other materials, which include electrical traces thereon, to provide external connections for the semiconductor light emitting device. A second substrate, which may comprise silver plated copper, is mounted on the first substrate, for example, using glue, surrounding the semiconductor light emitting device. A lens may be placed on the second substrate over the semiconductor light emitting device. Light emitting diodes with two-piece packages as described above are described in Application Serial No. US 2004/0041222 A1 to Loh, entitled *Power Surface Mount Light Emitting Die Package*, published Mar. 4, 2004, assigned to the assignee of the present invention, the disclosure of which is hereby incorporated herein by reference in its entirety as if set forth fully herein.

For known power light emitting device packages, a relatively small heat-slug is typically utilized, which may include a portion of the associated electrical leads or an isolated piece. A molded plastic body typically occupies a major part of the package and wraps around the heat spreading component. A lens may be mounted on top of the plastic body and surrounding an optical cavity, and an epoxy or soft gel encapsulant material may be used to fill the cavity. Such a product may not be surface mount technology (SMT) compatible, as its packaging materials generally cannot withstand solder reflow temperatures. In addition, during use, the soft encapsulant may tend to form bubbles or delaminate from the enclosure walls, which may adversely affect device reliability. It is also known to form the lens using a dispensing method capitalizing on the viscosity of a resin used in forming the lens.

It is also known to use transfer molding of epoxy to encapsulate certain low power LED packages, such as miniature surface mountable devices available from Hewlett Packard Corporation. The epoxy on such devices may provide structural strength to the package as well as encapsulating the devices inside. It is also known to use casting to encapsulate LED devices with epoxy. This process typically can only be applied to an open chamber, where curing may occur with the epoxy contained in a cup and a lead frame may be inserted inside the cup and be casted when the epoxy is cured. During curing, a level of liquid epoxy is generally free to adjust itself as a result of chemical reactions and shrinkage in volume.

In some applications, it is desirable to use a side-mounted light emitting device package or other means of direction emitted light at an angle substantially parallel to an underlying substrate. Such packages may be provided using a lead frame technology, and the lead frame may be appropriately bent to support the electrical connections for a side-mounted device. It may also be desirable to provide a narrow angle of illumination in some applications. For example, lighting for cellular telephone screens or the like may utilize a narrow beam of light directed under the display screen and light may need to be launched into a narrow substrate in some applications.

SUMMARY OF THE INVENTION

Some embodiments of the present invention provide side-mountable semiconductor light emitting device packages including an electrically insulating substrate having a front face and a back face and a side face extending therebetween. The side face is configured for mounting on an underlying surface. An electrically conductive contact is provided proximate an edge of the substrate on the back face of the substrate and/or on a recessed region on the side face of the substrate. The contact can be positioned proximate an electrical connection region of the underlying surface when the semiconductor light emitting device package is side mounted on the underlying surface. A conductive trace extends along the front face of the substrate and is electrically connected to the contact. A semiconductor light emitting device is mounted on the front face of the substrate and electrically connected to the conductive trace.

In further embodiments, the semiconductor light emitting device package further includes a reflector on the front face of the substrate and defining a reflector cavity around the semiconductor light emitting device. The reflector may be bonded to the front face of the substrate. The reflector may be a ceramic. An encapsulant may be provided in the reflector cavity and covering the semiconductor light emitting device. The encapsulant may be epoxy and/or silicone, and may include an additive selected to provide a desired optical property to the semiconductor light emitting device package. A lens may be mounted on the reflector over the reflector cavity.

In other embodiments, a thickness of the semiconductor light emitting device package from the back face of the substrate to an upper surface of the reflector is no more than about 10 millimeters (mm). The side face may be a first side face and the substrate may include a second side face, opposite the first side face, and a thickness of the semiconductor light emitting device package from the first side face to the second side face is no more than about 10 millimeters (mm). An angle of illumination of the semiconductor light emitting device package relative to the underlying surface when the semiconductor light emitting device is mounted on the underlying surface may be no more than about 75°.

In further embodiments the substrate is a thermally conductive dielectric material. The thermally conductive dielectric material may be ceramic or a high thermal-conductive plastic. The contact may be an electrically conductive trace on a surface of the side and/or back face of the substrate. The electrically conductive contact may be on a surface of the recessed region on the side face of the substrate and the recessed region may be a substantially semi-circular region on an edge of the side face of the substrate.

In yet other embodiments, the contact includes a first contact on a first recessed region on the side face of the substrate and a second contact on a second recessed region on the side face of the substrate and the conductive trace includes a first conductive trace electrically connected to the first contact and a second conductive trace connected to the second contact. An anode of the semiconductor light emitting device is electrically connected to the first conductive trace and a cathode of the semiconductor light emitting device is electrically connected to the second conductive trace. The first recessed region may be a substantially semi-circular region on a first edge of the side face of the substrate and the second recessed region may be a substantially semi-circular region on a second, opposite edge of the side face of the substrate. The side face may include a first side face including the first and second recessed regions and a second side face, opposite the first side face and having a third recessed region having a third contact electrically connected to the first conductive trace and a fourth recessed region including a fourth contact electrically connected to the second conductive trace. The first and third recessed regions may be substantially semi-circular regions on a first edge of the respective first and second side faces of the substrate and the second and fourth recessed regions may be substantially semi-circular regions on a second, opposite edge of the respective first and second side faces of the substrate.

The semiconductor light emitting device package may be configured for selective mounting on the underlying surface on the first side face or the second side face. The first and/or second side face of the substrate may be configured to provide a selected angular orientation of a primary direction of emission of the semiconductor light emitting device package relative to the underlying surface when the semiconductor light emitting device package is mounted on the underlying surface. The first and second side face of the substrate may provide different angular orientations of the semiconductor light emitting device package relative to the underlying surface when the semiconductor light emitting device package is mounted on the underlying surface on a selected one of the first and second side face.

In further embodiments, the contact includes a first contact on the back face of the substrate proximate a first edge of the side face of the substrate and a second contact on the back face of the substrate proximate a second, opposite edge of the side face of the substrate. The conductive trace includes a first conductive trace electrically connected to the first contact and a second conductive trace connected to the second contact. An anode of the semiconductor light emitting device is electrically connected to the first conductive trace and a cathode of the semiconductor light emitting device is electrically connected to the second conductive trace. The side face may include a first side face and the semiconductor light emitting device package may include a second side face, opposite the first side face and having a third contact proximate a first edge of the second side face and electrically connected to the first conductive trace and a fourth contact proximate a second edge of the second side face and electrically connected to the second conductive trace. The semiconductor light emitting device package may be configured for selective mounting on the underlying surface on the first side face or the second side face.

In yet other embodiments, electronic devices are provided including a semiconductor light emitting device package as described above and further including the underlying surface with the semiconductor light emitting device package mounted thereon on its side face and an electrical connection between the electrical connection region of the underlying surface and the contact. The contact may be a solder pad and the electrical connection may be a solder connection.

In further embodiments, panels are provided including a plurality of side-mountable semiconductor light emitting device packages. The panel includes an electrically insulating substrate having a front face and a back face. A plurality of openings extend through the substrate. The openings have an electrically conductive material defining a side face contact therein. A plurality of conductive traces extend along the front face of the substrate, respective ones of which are electrically connected to an associated one of the side face contacts. A plurality of semiconductor light emitting devices are mounted on the front face of the substrate and electrically connected to an associated one of the conductive traces. A reflector assembly on the front face of the substrate includes a plurality of reflector cavities, ones of which extend around respective ones of the semiconductor light emitting devices to define respective ones of the plurality of side-mountable semiconductor light emitting device packages. A spacing between respective ones of the conductive traces is selected to allow separation of the respective semiconductor light emitting device packages to create a side face of the respective semiconductor light emitting device packages configured for mounting on an underlying surface and including the associated one of the side face contacts thereon.

In further embodiments, the conductive traces comprise pairs of conductive traces, each of which is associated with a respective opening having a respective side face contact therein, and the respective semiconductor light emitting device packages have an anode and a cathode connected to respective ones of the associated pair of conductive traces. A second opening including a second side face contact associated with each of the conductive traces may be provided, wherein the openings are positioned to allow separation of the respective semiconductor light emitting device packages to create first and second side faces of the respective semiconductor light emitting device packages configured for mounting on an underlying surface and including the associated one of the side face contacts thereon.

In other embodiments, a side-mountable semiconductor light emitting device package includes an electrically insulating substrate and a reflector. The electrically insulating substrate has a front face and a back face and a side face extending therebetween. The side face is configured to mount on an underlying surface. The front face is configured to mount a semiconductor light emitting device thereon. The reflector is on the front face of the substrate and defines a reflector cavity configured to extend around a semiconductor light emitting device mounted on the front face of the substrate. The electrically insulating substrate and/or the reflector is ceramic.

In further embodiments, a panel including a plurality of side-mountable semiconductor light emitting device packages includes an electrically insulating substrate and a reflector assembly. The electrically insulating substrate has a front face configured to mount a semiconductor light emitting device thereon and a back face. The reflector assembly is on the front face of the substrate and includes a plurality of reflector cavities, ones of which are configured to extend around respective semiconductor light emitting devices mounted on the substrate to define respective ones of the plurality of side-mountable semiconductor light emitting device packages. A spacing between respective ones of the reflector cavities is selected to allow separation of the respective semiconductor light emitting device packages to create a side face of the respective semiconductor light emitting device packages configured to mount on an underlying surface. The electrically insulating substrate and/or the reflector assembly is ceramic.

In yet other embodiments, methods of forming a semiconductor light emitting device package include providing an electrically insulating substrate having a front face and a back face. A plurality of openings is formed extending through the substrate. An electrically conductive material defining a side face contact is formed in the respective openings. A plurality of conductive traces are formed extending along the front face of the substrate, respective ones of which are electrically connected to an associated one of the side face contacts. A plurality of semiconductor light emitting devices are mounted on the front face of the substrate. The semiconductor light emitting devices are electrically connected to an associated one of the conductive traces. A reflector assembly is mounted on the front face of the substrate that includes a plurality of reflector cavities to define respective ones of the plurality of side-mountable semiconductor light emitting device packages. The respective semiconductor light emitting device packages are separated in a region between respective ones of the conductive traces to create a side face of the respective semiconductor light emitting device packages configured for mounting on an underlying surface and including the associated one of the side face contacts thereon.

BRIEF DESCRIPTION OF THE DRAWINGS

FIG. 3 is a top plane view of the semiconductor light emitting device package of FIG. 1.

FIG. 4 is a side plane view of the semiconductor light emitting device package of FIG. 1.

FIG. 5A is a bottom plane view of the semiconductor light emitting device package of FIG. 1.

FIG. 5B is a bottom plane view of the semiconductor light emitting device package of FIG. 1 according to further embodiments.

FIG. 6 is a cross-sectional view of the semiconductor light emitting device package of FIG. 3 taken along line 6-6 of FIG. 3.

FIG. 7 is a cross-sectional view of the semiconductor light emitting device package of FIG. 3 taken along line 7-7 of FIG. 3.

FIG. 9 is a top plane view of the substrate of FIG. 8 according to some embodiments of the present invention.

FIG. 10 is a top plane view of the reflector of FIG. 8 according to some embodiments of the present invention.

DETAILED DESCRIPTION

Figure 1:
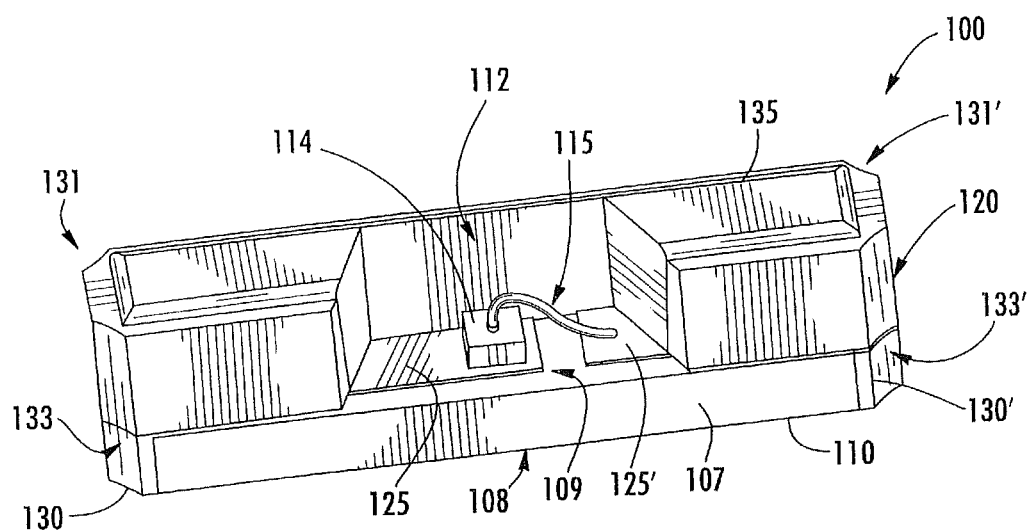
FIG. 1 is a partially cut-out perspective view of a side-mountable semiconductor light emitting device package according to various embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Some embodiments of side-mountable semiconductor light emitting device packages and panels including the same and methods for forming the same will now be described with reference to FIGS. 1-11. As illustrated in FIGS. 1 and 3-7, a side-mountable semiconductor light emitting device package 100 includes an electrically insulating substrate 110 and a reflector 120. The substrate 110 has a front face 109, a back face 108, and first and second side faces 107, 107' extending therebetween. One or more of the side faces 107, 107' is configured for mounting on an underlying substrate 150, 150' (see FIG. 5A).

As best seen in the bottom view of FIG. 5A, an electrically conductive contact or contacts are provided on the substrate 110, which contact(s) are positioned so as to be positioned proximate an electrical connection region 152 of an underlying substrate 150, 150' when the semiconductive light emitting device package 100 is side-mounted on the underlying substrate 150, 150'. The electrically conductive contacts may be positioned proximate an edge of the substrate 110 on the back face 108 of the substrate 110, as shown by the contacts 522 in FIG. 5A. The contacts may alternatively or additionally be provided on a recessed region 131, 131', 133, 133' on the respective side faces 107, 107' of the substrate 110.

As will be further described later herein, the particular arrangement of contacts shown in the embodiments of FIG. 1 and FIGS. 2-7 may be used to provide two distinct respective electrical contact points for side mounting of the package 100 selectively on either the first side face 107 or the second side face 107'. For example, as seen in FIG. 5A for contacts on a recessed region on the side face 107 of the substrate, a first contact 130 on a first edge of the side face 107 and a second contact 130' on a second opposite edge of the first side face 107 are illustrated. Similarly, respective first and second side edge contacts 132, 132' are shown on the second side face 107'.

A first conductive trace 125 and a second conductive trace 125' extend along the front face 109 of the substrate 110 and electrically connect to respective contacts. More particularly, the conductive trace 125 is electrically connected to the contacts 130 and 132 while the trace 125' is connected to the contacts 130', 132'. A semiconductor light emitting device 114 is mounted on the front face 109 of the substrate 110 and is electrically connected to the conductive traces 125, 125'. The reflector 120 defines a reflector cavity 112 around the semiconductor light emitting device 114. An encapsulant 135 in reflector cavity 112 covers the semiconductor light emitting device 114. The encapsulant 135 may be, for example, an epoxy and/or silicone and may include an additive selected to provide a desired optical property to the semiconductor light emitting device package 100.

Additives to affect optical properties may include a phosphor, a scatter agent, a luminescent material and/or other material affecting optical characteristics of the emitted light. In some embodiments, multiple compression molds may be used to produce compression molded lenses where both the first and the second optical elements are compression molded to produce lenses having desired optical properties, such as viewing angles. LEDs that employ phosphor coatings are described, for example, in U.S. Pat. Nos. 6,252,254; 6,069,440; 5,858,278; 5,813,753; 5,277,840; and 5,959,316.

Further embodiments are shown in the bottom view of FIG. 5B. The embodiments of FIG. 5B differ from FIG. 5A in that the contacts 522 may provide a separate third contact, such as a neutral, rather than an anode or cathode contact. Thus, as seen in FIG. 5B, the contacts 522 are not electrically connected to the contacts 130, 132, 130', 132'.

As seen in FIG. 1, the light emitting device 114 is electrically connected by a bond wire 115 on a first end thereof to the conductive trace 125'. A second connection may be provided to the light emitting device 114 by a contact on a bottom surface thereof and/or by another bond wire 115 to the conductive trace 125. The respective connections may be to an anode and a cathode of the light emitting device 114.

The semiconductor light emitting device(s) 114 can comprise a light emitting diode, laser diode and/or other device which may include one or more semiconductor layers, which may comprise silicon, silicon carbide, gallium nitride and/or other semiconductor materials, a substrate which may comprise sapphire, silicon, silicon carbide, gallium nitride or other microelectronic substrates, and one or more contact layers which may comprise metal and/or other conductive layers. The design and fabrication of semiconductor light emitting devices are well known to those having skill in the art.

For example, the light emitting device(s) 114 may be gallium nitride based LEDs or lasers fabricated on a silicon carbide substrate such as those devices manufactured and sold by Cree, Inc. of Durham, N.C. For example, the present invention may be suitable for use with LEDs and/or lasers as described in U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled *Group III Nitride Based Light Emitting Diode Structures With a Quantum Well and Superlattice, Group III Nitride Based Quantum Well Structures and Group III Nitride Based Superlattice Structures*, published Jan. 9, 2003, as well as published U.S. Patent Publication No. US 2002/0123164 A1 entitled *Light Emitting Diodes Including Modifications for Light Extraction and Manufacturing Methods Therefor*. Furthermore, phosphor coated LEDs, such as those described in United States Patent Application No. US 2004/0056260 A1, published on Mar. 25, 2004, entitled *Phosphor-Coated Light Emitting Diodes Including Tapered Sidewalls, and Fabrication Methods Therefor*, the disclosure of which is incorporated by reference herein as if set forth fully, may also be suitable for use in embodiments of the present invention.

The LEDs and/or lasers may be configured to operate such that light emission occurs through the silicon carbide substrate. In such embodiments, the silicon carbide substrate may be patterned so as to enhance light output of the devices as is described, for example, in the above-cited U.S. Patent Publication No. US 2002/0123164 A1.

In some embodiments of the present invention, a thickness $t_1$ (FIG. 7) of the semiconductor light emitting device package 100 from the back face 108 of the substrate 110 to an upper surface of the reflector 120 is no more than about 10 millimeters (mm). A thickness $t_2$ (FIG. 4) of the semiconductor light emitting device package 100 from the first side face 107 to the second side face 107' is no more than about 10 millimeters (mm) in some embodiments of the present invention. An angle of illumination of the semiconductor light emitting device package 100 relative to the underlying substrate (surface) 150 when the semiconductor light emitting device package 100 is mounted on the underlying substrate 150 in some embodiments is not more than about 75°.

As seen in FIG. 5A, in some embodiments of the present invention, the semiconductor light emitting device package 100 is configured for selective mounting on an underlying substrate 150 on the second side face 107' or an underlying substrate 150' on the first side face 107. The first and/or second side face 107, 107' of the substrate 110 are configured to provide a selected angular orientation of the semiconductor light emitting device relative to the underlying substrate 150 when the semiconductor light emitting device package 100 is mounted on the underlying substrate 150. As illustrated in the embodiments of FIGS. 1-7, each side face 107, 107' provides a zero degree angular orientation of light emission of the semiconductor light emitting device package 100 relative to the underlying substrate 150. However, it will be understood that different angular orientations may be provided by providing a slope on the respective side face 107, 107' and, furthermore, that the first 107 and second 107' side face may provide different angular orientations of the semiconductor light emitting device package 100.

An electronic device may be provided including the semiconductor light emitting device package 100 and further including the underlying substrate 150, as shown in FIG. 5A, with the semiconductor light emitting device package 100 mounted thereon on its side face 107, 107' and an electrical connection, for example, by soldering, between the electrical connection region 152 of the underlying substrate 150 and the respective contacts 132, 132' as shown with respect to the orientation to the substrate 150 in FIG. 5A. Similarly, the connections with respect to the substrate 150' may be provided to the contacts 130, 130'. The contacts 130, 130', 132, 132', 522 may be solder pads and the electrical connection of the underlying substrate 150, 150' may be solder connections.

Figure 2:
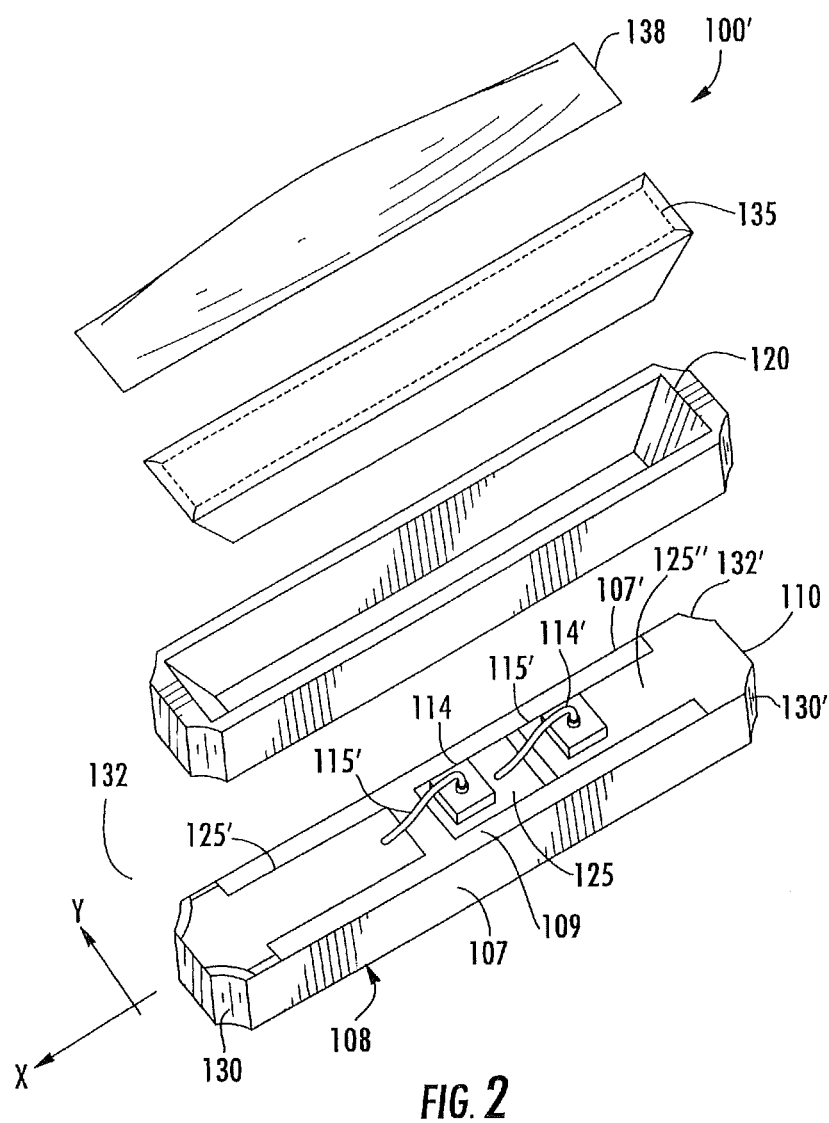
FIG. 2 is an exploded perspective view of a side-mountable semiconductor light emitting device package according to some embodiments of the present invention.

The embodiments of a semiconductor light emitting device package 100' illustrated in FIG. 2 generally correspond to those described previously with respect to FIGS. 1 and 2-7. The embodiments illustrated in FIG. 2 differ in the inclusion of a lens 130A mounted on the reflector 120 over the reflector cavity 112 and in the inclusion of a plurality of serially connected semiconductor light emitting devices 114, 114' instead of a single light emitting device. Thus, as shown in FIG. 2, the light emitting device 114 is mounted on a first conductive trace 125 and coupled by a bond wire 115 to a second conductive trace 125', which conductive trace 125' is further in electrical contact with solder pads 130, 132 in respective semi-circular recessed regions on side faces 107, 107'. A second light emitting device 114' is mounted on a third conductive trace 125" that extends to and electrically contacts respective solder pads 130', 132' on associated side faces 107, 107'. A bond wire 115' electrically connects the light emitting device 114' to the conductive trace 125 on which the first light emitting device 114 is mounted.

Figure 8:
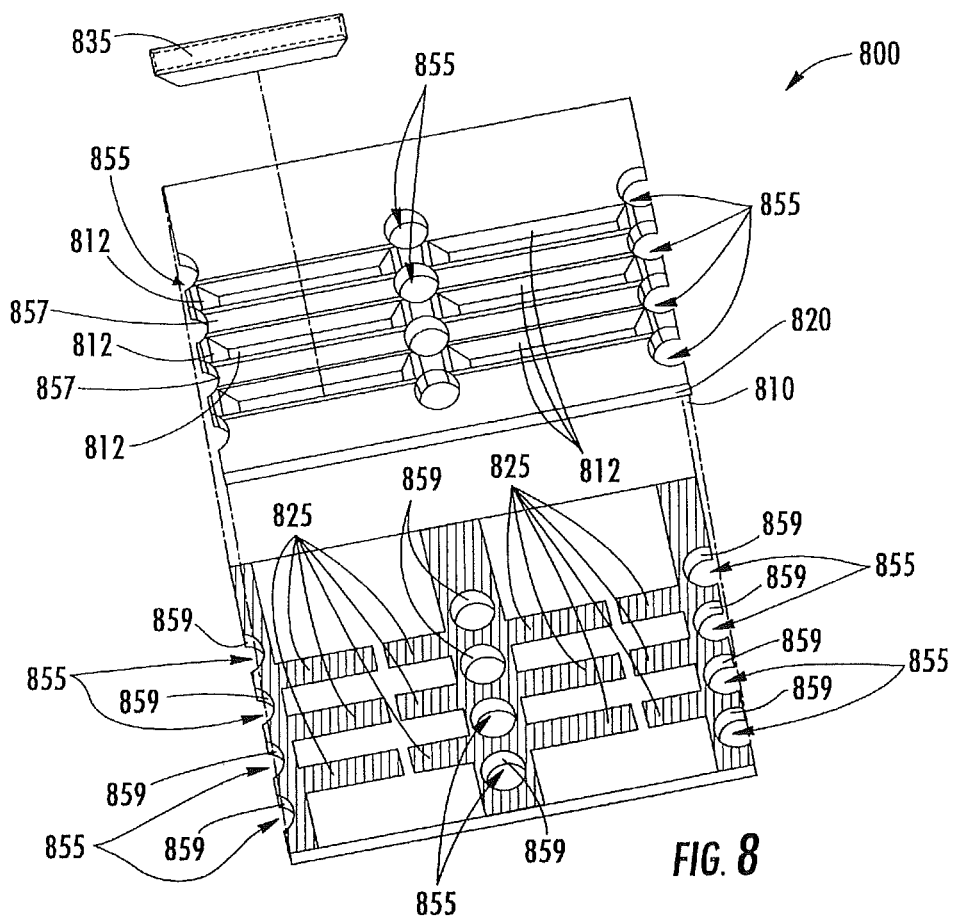
FIG. 8 is an exploded perspective view of a panel including a plurality of side-mountable semiconductor light emitting device packages according to some embodiments of the present invention.

Some embodiments of a panel 800 including a plurality of side-mountable semiconductor light emitting device packages will now be described with reference to FIGS. 8-10. FIG. 8 is an exploded respective view of a panel 800 including an electrically insulating substrate 110 and a reflector assembly 820. FIG. 9 is a top plane view of the substrate 810. FIG. 10 is a top plane view of the reflector assembly 820.

As seen in FIG. 8, the panel 800 is shown as including two columns each having three respective semiconductor light emitting device package arrangements including respective reflector cavities 812. For illustrative purposes, only one of the reflector cavities 812 is shown as including an encapsulant 835. As seen in FIG. 10, the reflector cavities 812 are defined by reflector assembly 820.

As seen in FIGS. 8 and 9, substrate 810 includes a plurality of conductive traces 825 extending along a front face 809 of the substrate 810. More particularly, the conductive traces 825 are shown as pairs of conductive traces with an insulating gap therebetween.

In the particular embodiments of the panel 800 shown in FIGS. 8-10, a plurality of openings 855 extend through the substrate 810 and the reflector assembly 820 which openings 855 have an electrically conductive material defining a side face contact 859 therein. Respective ones of the conductive traces 825 are electrically connected to associated ones of the side face contacts 859. While not shown in the illustrations of FIGS. 8-10, it will be understood that, as described previously with reference to the semiconductor light emitting device package 100, a plurality of semiconductor light emitting devices may be mounted on the front face 809 of the substrate 810 and electrically connected to an associated one of the conductive traces and the corresponding conductive trace of a pair of conductive traces to provide, for example, an anode/cathode connection to the respective semiconductor light emitting devices.

As further seen in FIG. 8, a region 857 extending between the respective reflector cavities 812 defines a spacing between respective ones of the conductive traces 825 that is selected to allow separation of the semiconductor light emitting device packages and to create a side face of the respective semiconductor light emitting device packages configured for mounting on an underlying substrate. The side face(s) include the associated one(s) of the side face contacts 859 thereon for solder connection or the like to an underlying substrate. Thus, as shown in the arrangement of FIG. 8, an individual opening 855 may provide definition for two distinct contacts on respective facing ones of the semiconductor light emitting device packages arranged on the panel 800, which contacts are separated by sawing or the like through the regions 857 and through the openings 855.

Figure 11:
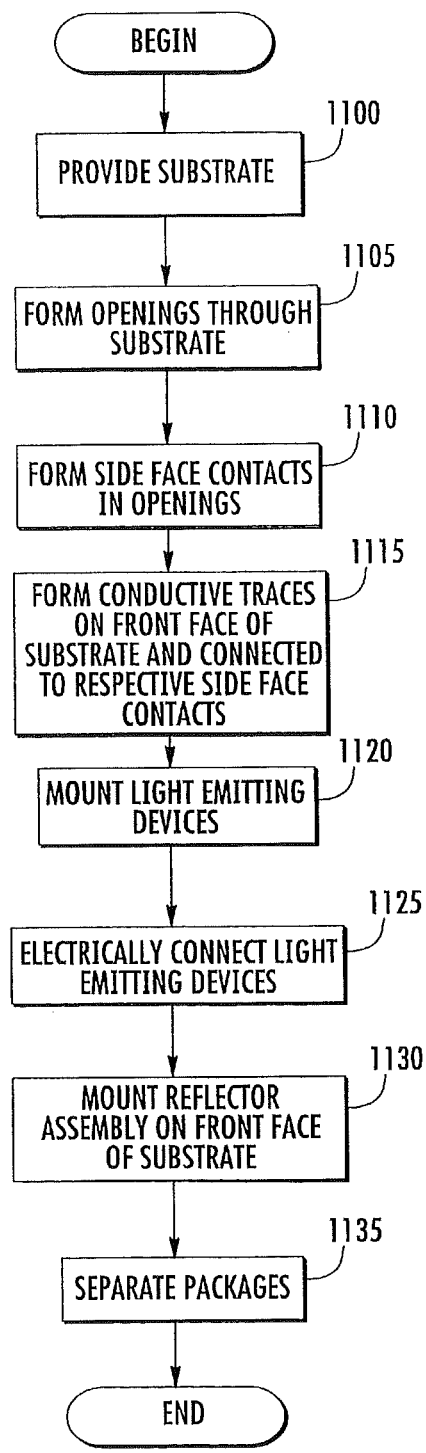
FIG. 11 is a flow chart illustrating operations for forming a side-mountable semiconductor light emitting device package according to some embodiments of the present invention.

A method of forming a semiconductor light emitting device package that is side-mountable according to some embodiments of the present invention will now be described with reference to the flowchart illustration of FIG. 11. As shown in the embodiments of FIG. 11, operations begin by providing an electrically insulating substrate having a front face and a back face (block 1100). A plurality of openings are formed extending through the substrate (block 1105). An electrically conductive material defining a side face contact is formed in the respective opening (block 1110). A plurality of conductive traces extending along the front face of the substrate are formed, respective ones of which are electrically connected to an associated one of the side face contacts in the openings formed at block 1105 (block 1115).

A plurality of semiconductor light emitting devices are mounted on the front face of the substrate (block 1120). The semiconductor light emitting devices are electrically connected to an associated one of the conductive traces (block 1125).

A reflector assembly is mounted on the front face of the substrate (block 1130). The reflector assembly includes a plurality of reflector cavities, ones of which extend around respective ones of the semiconductor light emitting devices to define respective ones of the plurality of side-mountable semiconductor light emitting device packages. It will be understood that the reflector assembly may be mounted on the front face of the substrate before mounting and/or electrically connecting the light emitting devices. The respective semiconductor light emitting device packages are separated in a region between respective ones of the conductive traces to create a side face of the respective semiconductor light emitting device packages configured for mounting on an underlying substrate and including the associated ones of the side face contacts thereon (block 1135). It will be understood that respective light emitting devices may be coupled at respective anode/cathode ends thereof to different ones of a pair of conductive traces and, as illustrated in the embodiments of FIG. 2, a plurality of semiconductor light emitting devices may be provided, which may be connected in series to provide a single package including a plurality of light emitting devices therein. Furthermore, before separation of the respective packages, in addition to the electrical connections, the encapsulant and/or a lens may be provided on the respective packages.

As described above with reference to various embodiments of the present invention, a chip-scale sized emitter having a narrow illuminating face may be provided that can be mounted on one of its side faces. More particularly, the side faces may be shaped to any desired angular plane to direct the illuminating beam of the chip-scale size emitter accordingly. The substrate 110 may be a very narrow substrate, which may be made of a thermally conductive dielectric material, such as ceramics or high thermal-conductive plastics. Electrical conductive traces 125, 125' may, for example, be printed, plated and/or deposited on the dielectric substrate base. Substrates may, in some embodiments be economically made from a sheet of dielectric using thick-film and/or thin-film technologies and then sawn or otherwise cut into singulated packaged units.

More particularly, for some embodiments of the present invention, the inventors have discovered that a ceramic substrate and/or reflector may be used to cost effectively produce a very thin side mountable semiconductor light emitting device package. As such, while the material cost for the substrate and/or reflector may be more expensive when using ceramic, this material cost may be more than offset by the benefits in fabricating the semiconductor light emitting package where a thin side-mountable semiconductor light emitting device is desired for particular applications, for example, back light in cellular telephone displays.

The corresponding narrow reflector 120 for use with a substrate may be made of a highly reflective material and to a desired inneroptical shape. The reflector 120 may operate to surround a light emitting device chip mounted on the substrate so that the light emitted from the chip or chips on the substrate and surrounded by the reflector can be conserved, directed and/or the like to provide a desired illumination. The reflector 120 may be bonded to the substrate 110 to become an integral portion of the substrate 110 before assembly of the light emitting device chip on the substrate. The reflectors may be mass manufactured in some embodiments by forming many reflectors in a sheet of raw material, such as ceramics or metal, as seen in FIG. 10.

In particular embodiments where ceramics, for example, alumina, is used to form the reflectors, an optical shape may be provided by using a forming tool to press on the ceramics material in its soft "green" stage before sintering by powder technology or the like. Furthermore, when both substrates and reflectors are made in sheets of identical unit registration (pitch), they can be bonded together to form a composite sheet of substrates, each complete with its respective thermal, electrical and/or optical features defined. Indexing for registration may be facilitated, for example, by use of the openings 855 shown in FIGS. 8-10 for registration purposes of the respective substrate 810 and reflector assembly 820. The encapsulant 135, 835 may be a clear and/or optically transmitting medium, such as epoxy and/or silicone. This encapsulant may be used to encase the light emitting device chip or chips 114 to protect the light emitting device(s) and further, to maximize light extraction from the light emitting device 114. As described previously, the encapsulant 135, 835 may be loaded with, for example, fine particles of diffusant materials, such as silica, to scatter light and/or phosphors to absorb certain wavelengths of light emitted by the light emitting device 114 and re-emit other wavelengths of light. An imaging optical lens 138 may be mounted on a reflector 120 and in contact with the encapsulant 135 to refract light to form a desired radiation pattern.

As described above, some embodiments of the present invention may provide a very narrow high quality and robust chip-scale emitter that can be mass produced cost-effectively in a sheet form that comprises many units (for example, in the thousands). Furthermore, the angle of (side) illumination with respect to the emitting packages underlying substrate mounting board 25 surface can be precisely pre-determined and cut in some embodiments of the present invention. The light emitting devices mounted in respective packaged units of a large scale panel or sheet of packaged units may, in some embodiments, be mass coated with phosphors or other chemicals more efficiently than in some prior approaches. The semiconductor light emitting device packages may be used, for example, for power surface mount light emitting die packages or other types of light emitting packages where a side mounting is desired. For example, some embodiments of semiconductor light emitting device packages according to the present invention may be particularly suited for use in cellular phone screens or the like for backlighting.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A semiconductor light emitting device package comprising:
    an electrically insulating substrate having a front face and a back face and a side face extending therebetween, the front face being configured to mount a semiconductor light emitting device thereon, wherein the semiconductor light emitting device package is a side-mountable semiconductor light emitting device package and the side face is configured to mount on an underlying surface;
    an electrically insulating and thermally conducting reflector on the front face of the substrate and defining a reflector cavity configured to extend around the semiconductor light emitting device mounted on the front face of the substrate, wherein the electrically insulating substrate and the reflector comprise ceramic;
    an electrically conductive contact on the back or side face of the substrate and not on the reflector, the electrically conductive contact being positioned to be proximate an electrical connection region of the underlying surface when the semiconductor light emitting device package is mounted on the underlying surface; wherein the electrically conductive contact comprises a solder pad and an electrical connection comprises a solder connection;
    a conductive trace extending along the front face of the substrate and electrically connected to the electrically conductive contact; and the semiconductor light emitting device mounted on the front face of the substrate and electrically connected to the conductive trace.

2. The semiconductor light emitting device package of claim 1, wherein a face of the reflector in the reflector cavity has no conductive surfaces.

3. The semiconductor light emitting device package of claim 1, wherein a thickness of the semiconductor light emitting device package from the back face of the substrate to an upper surface of the reflector is no more than about 10 millimeters (mm).

4. The semiconductor light emitting device package of claim 1, wherein an angle of illumination of the semiconductor light emitting device package relative to the underlying surface when the semiconductor light emitting device is mounted on the underlying surface is no more than about 75°.

5. The semiconductor light emitting device package of claim 1, wherein the reflector is bonded to the front face of the substrate.

6. The semiconductor light emitting device package of claim 1, wherein the side face comprises a first side face and wherein the substrate includes a second side face, opposite the first side face and wherein a thickness of the semiconductor light emitting device package from the first side face to the second side face is no more than about 10 millimeters (mm).

7. An electronic device including the semiconductor light emitting device package of claim 1, and further comprising the underlying surface with the semiconductor light emitting device package mounted thereon and the electrical connection between the electrical connection region of the underlying surface and the electrically conductive contact.

* * * * *